(12) United States Patent
Jung

(10) Patent No.: US 12,512,442 B2
(45) Date of Patent: Dec. 30, 2025

(54) SEMICONDUCTOR PACKAGE AND METHOD OF MANUFACTURE

(71) Applicant: SAMSUNG ELECTRONICS CO., LTD., Suwon-si (KR)

(72) Inventor: Hwanwook Jung, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 298 days.

(21) Appl. No.: 18/201,837

(22) Filed: May 25, 2023

(65) Prior Publication Data
US 2024/0079379 A1    Mar. 7, 2024

(30) Foreign Application Priority Data

Sep. 2, 2022    (KR) .................. 10-2022-0111130

(51) Int. Cl.
| | |
|---|---|
| *H01L 25/065* | (2023.01) |
| *H01L 23/00* | (2006.01) |
| *H01L 23/31* | (2006.01) |
| *H01L 23/498* | (2006.01) |

(52) U.S. Cl.
CPC ...... *H01L 25/0657* (2013.01); *H01L 23/3128* (2013.01); *H01L 23/49838* (2013.01); *H01L 24/16* (2013.01); *H01L 24/32* (2013.01); *H01L 24/48* (2013.01); *H01L 24/73* (2013.01); *H01L 2224/16227* (2013.01); *H01L 2224/32225* (2013.01); *H01L 2224/48227* (2013.01); *H01L 2224/73265* (2013.01); *H01L 2225/0651* (2013.01); *H01L 2225/06517* (2013.01); *H01L 2225/06558* (2013.01); *H01L 2924/1434* (2013.01)

(58) Field of Classification Search
CPC . H10B 80/00; H01L 25/0657; H01L 23/3128; H01L 23/49838; H01L 24/16; H01L 24/32; H01L 24/48; H01L 24/73
USPC ....................................................... 257/777
See application file for complete search history.

(56) References Cited

U.S. PATENT DOCUMENTS

| | | | |
|---|---|---|---|
| 8,896,111 B2 | 11/2014 | Tanimoto et al. | |
| 9,177,886 B2 | 11/2015 | Ko et al. | |
| 9,748,204 B2 | 8/2017 | Usami et al. | |
| 11,139,275 B2 | 10/2021 | Takaku | |
| 12,368,136 B2 * | 7/2025 | Kim ................... | H01L 23/3128 |
| 2005/0156323 A1 | 7/2005 | Tokunaga | |

FOREIGN PATENT DOCUMENTS

JP    20150176906 A    10/2015

* cited by examiner

*Primary Examiner* — Jasmine J Clark
(74) *Attorney, Agent, or Firm* — Fish & Richardson P.C.

(57) ABSTRACT

A semiconductor package includes; a package substrate, a first chip mounted on the package substrate, a support frame pattern surrounding the first chip and defining a trench between the first chip and the support frame pattern, an adhesive film at least partially filling the trench, second semiconductor chips stacked on the support frame pattern, bonding wires connecting chip pads associated with the semiconductor chips with the substrate pads, and a sealing member covering the second semiconductor chips.

20 Claims, 13 Drawing Sheets

SEMICONDUCTOR PACKAGE AND METHOD OF MANUFACTURE

CROSS REFERENCE TO RELATED APPLICATION

This U.S. non-provisional application claims priority under 35 U.S.C. § 119 to Korean Patent Application No. 10-2022-0111130 filed on Sep. 2, 2022 in the Korean Intellectual Property Office (KIPO), the subject matter of which is hereby incorporated by reference in its entirety.

BACKGROUND

1. Field

Embodiments of the inventive concept relate generally to semiconductor packages and methods of manufacture for semiconductor packages. More particularly, embodiments of the inventive concept relate to semiconductor packages including a plurality of different-type chips stacked on a package substrate, as well as manufacturing methods for same.

2. Description of the Related Art

Mobile devices such as smart phones and tablet Personal Computers (PCs) store information in an internal (or built-in) memory. Universal Flash Storage (UFS) is a multi-chip package (MCP) that may be used to implement built-in memories for various electronic products, including mobile devices. In contemporary MCPs like UFS, a spacer chip having a dolmen structure is disposed around a relatively small controller chip so that memory chips may be stacked on the controller chip. Unfortunately, additional fabrication processes and materials are required to form and assemble the spacer chip, and this tends to increases the overall manufacturing costs. Further, due to height difference(s) between the controller chip and the spacer chip, an adhesive film may be lifted from an upper surface of the controller chip, and this failure may allow sealing material(s) such as epoxy molding compound (EMC) to penetrate and negatively impact structural integrity.

SUMMARY

Certain embodiments of the inventive concept provide semiconductor packages exhibiting improved structural integrity with fewer process defects at reduced manufacturing costs. Other embodiments of the inventive concept provide methods of manufacturing same.

According to embodiments of the inventive concept, a semiconductor package may include; a package substrate including first substrate pads arranged in a chip mounting region and second substrate pads arranged along at least one side portion, a first semiconductor chip having a first height, mounted on the chip mounting region and electrically connected to the first substrate pads of the package substrate via conductive bumps, a support frame pattern on the package substrate, having a second height less than the first height, surrounding the first semiconductor chip, and defining a trench between the first semiconductor chip and an inner sidewall of the support frame pattern, second semiconductor chips stacked on the support frame pattern and the first semiconductor chip, an adhesive film attaching the second semiconductor chips to the support frame pattern, wherein at least a portion of the adhesive film at least partially fills the trench, conductive connecting members electrically connecting second chip pads respectively associated with the second semiconductor chips with the second substrate pads of the package substrate, and a sealing member covering an upper surface of the package substrate, the second semiconductor chips and the conductive connecting members.

According to embodiments of the inventive concept, a semiconductor package may include; a package substrate including first substrate pads arranged in a chip mounting region and second substrate pads arranged along at least one side portion, a first semiconductor chip mounted on the chip mounting region and electrically connected to the first substrate pads of the package substrate via conductive bumps, a dam structure on the package substrate, surrounding the first semiconductor chip, and defining a trench between the first semiconductor chip and an inner sidewall of the support frame pattern, second semiconductor chips stacked on the support frame pattern and the first semiconductor chip, an adhesive film attaching the second semiconductor chips to the support frame pattern, wherein part of the adhesive film at least partially fills the trench, bonding wires electrically connecting second chip pads respectively associated with the second semiconductor chips with the second substrate pads of the package substrate, and a sealing member covering the second semiconductor chips.

According to embodiments of the inventive concept, a semiconductor package may include; a package substrate including first substrate pads arranged in a chip mounting region and second substrate pads arranged along at least one side portion, a first semiconductor chip mounted on the chip mounting region and electrically connected to the first substrate pads of the package substrate via conductive bumps, a support frame pattern on the package substrate, surrounding the first semiconductor chip, and defining a trench between the first semiconductor chip and an inner sidewall of the support frame pattern, an adhesive film including a first adhesive film portion and at least one additional adhesive portion, wherein at least part of the first adhesive film portion partially fills the trench, a group of second semiconductor chips stacked on the support frame pattern, wherein the group of second semiconductor chips includes a lowermost second semiconductor chip attached to an upper surface of the support frame pattern using the first adhesive film portion and at least one additional second semiconductor chip attached to an upper surface of the lowermost second semiconductor chip using the at least one additional adhesive film portion, conductive connecting members electrically connecting second chip pads respectively associated with the lowermost second semiconductor chip and the at least one additional second semiconductor chip with the second substrate pads of the package substrate, and a sealing member formed on an upper surface of the package substrate and covering the second semiconductor chips.

BRIEF DESCRIPTION OF THE DRAWINGS

Advantages, benefits and features, as well as the making and use of the inventive concept may be more clearly understood upon consideration of the following detailed description together with the accompanying drawings, in which.

DETAILED DESCRIPTION

Throughout the written description and drawings, like reference numbers and labels are used to denote like or similar elements, components, devices, features and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
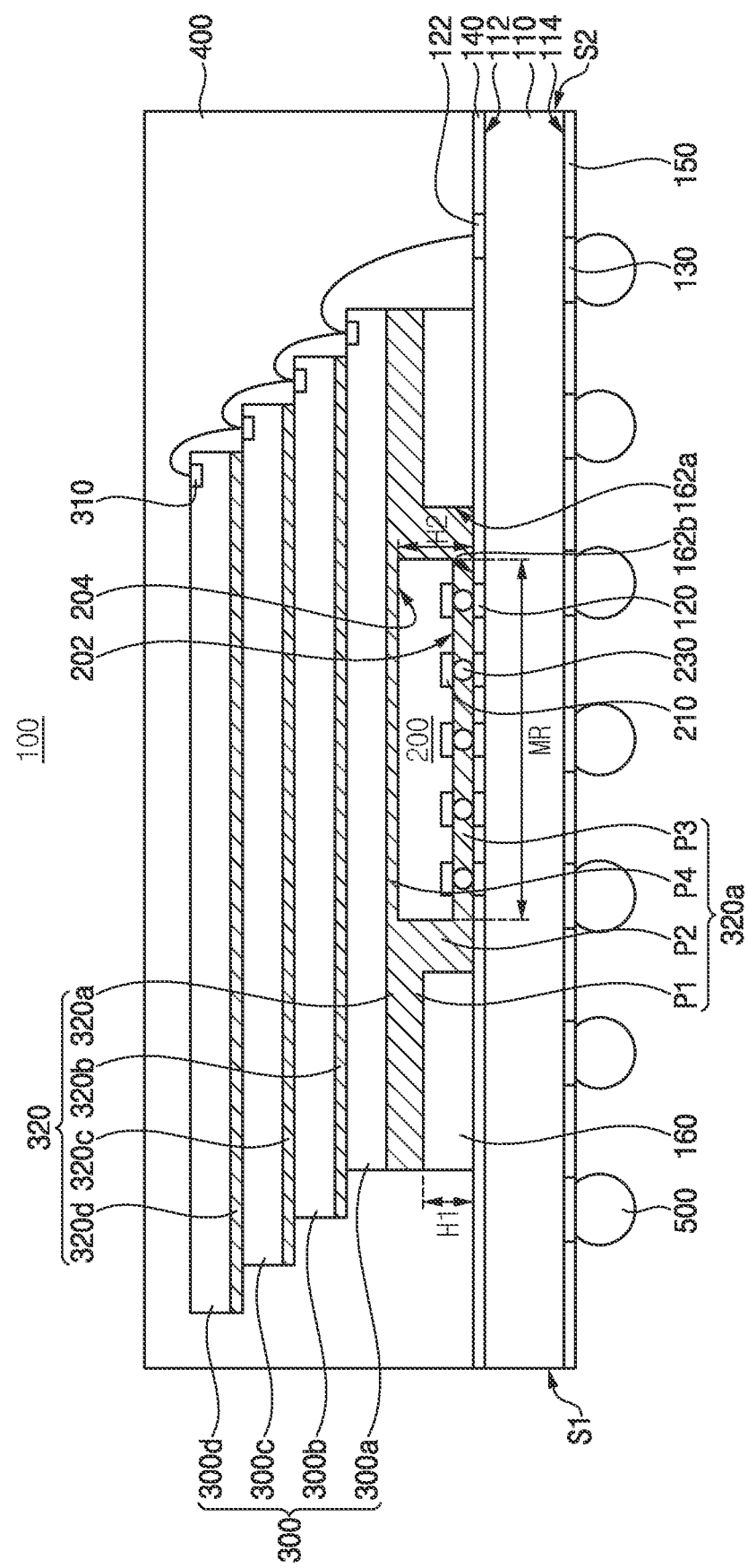
FIG. 1 is a cross-sectional view illustrating a semiconductor package 100 according to embodiments of the inventive concept.
Figure 2:
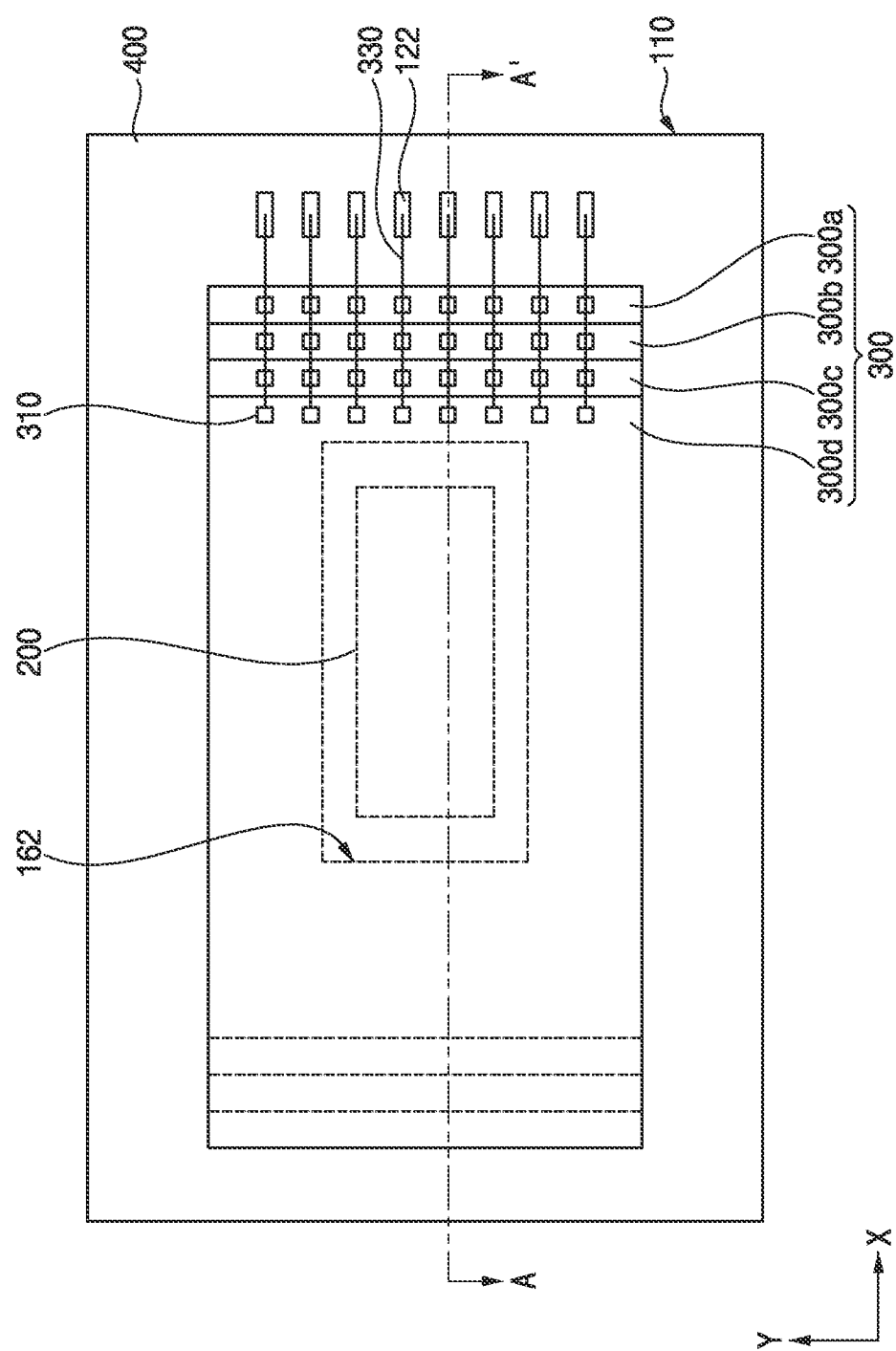
FIG. 2 is a plan (or top-down) view further illustrating the semiconductor package 100 of FIG. 1.

Figure (FIG. 1 is a cross-sectional view illustrating a semiconductor package 100 according to embodiments of the inventive concept; FIG. 2 is a plan view further illustrating the semiconductor package 100 of FIG. 1, wherein FIG. 1 is a cross-sectional view taken along the line A-A' in FIG. 2; and FIG. 3 is another plan view illustrating the semiconductor package 100 of FIG. 1 with the sealing member and the second semiconductor chips omitted.

Figure 3:
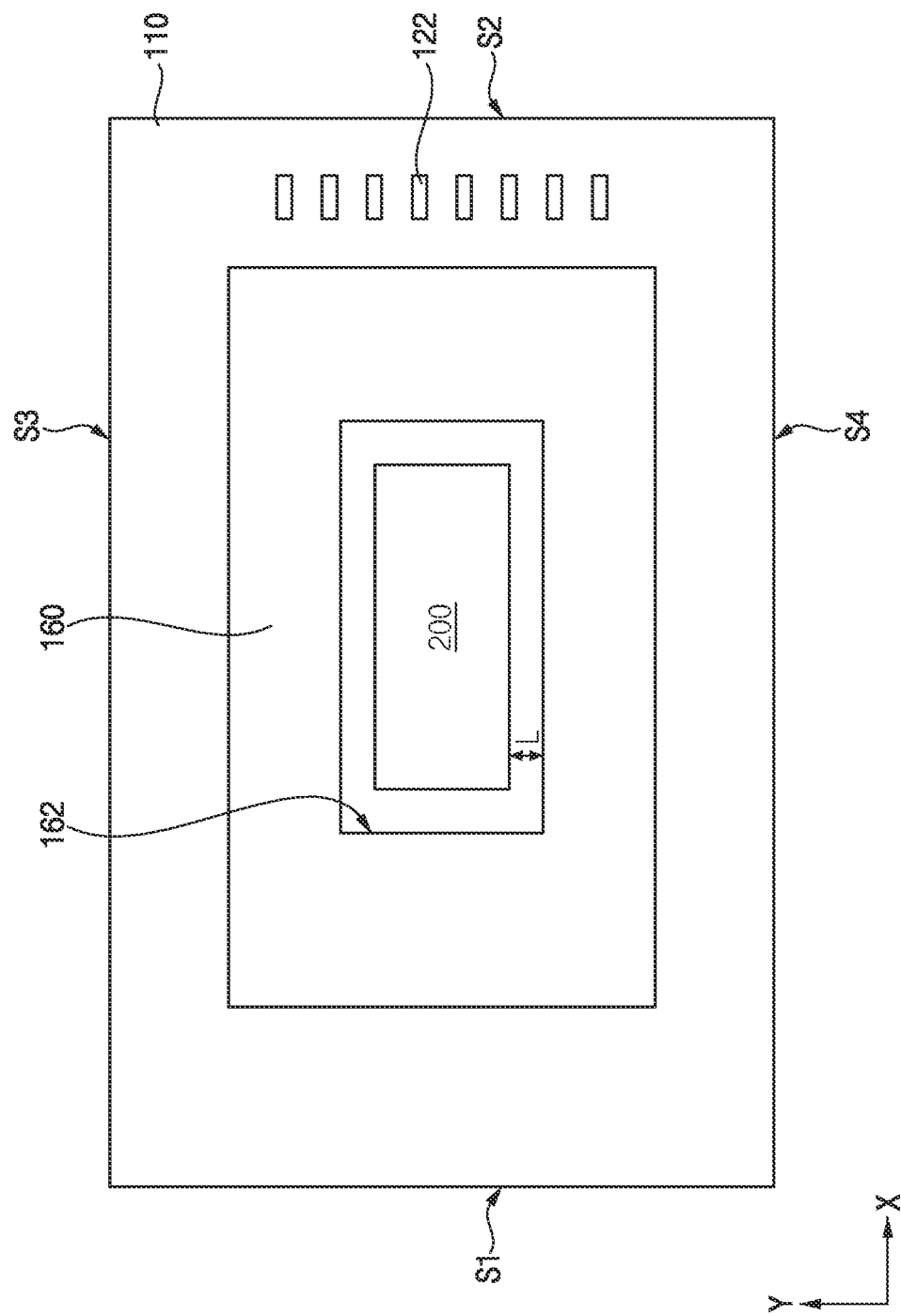
FIG. 3 is another plan view illustrating the semiconductor package 100 of FIG. 1 with the sealing member and the second semiconductor chips omitted FIGS. 4, 5, 6, 7, 8, 9, 10 and 11 (hereafter collectively, "FIGS. 4 to 11") are related plan and cross-sectional views illustrating in one example a method of manufacture for semiconductor packages accord to embodiments of the inventive concept.

Referring to FIGS. 1, 2 and 3, the semiconductor package 100 may include a package substrate 110 having a dam structure (e.g., a support frame pattern) 160, a first semiconductor chip 200, a stacked plurality of second semiconductor chips 300, conductive connecting members (e.g., bonding wires) 330 and a sealing member 400. Additionally, the semiconductor package 100 may further include external connection members 500.

In some embodiments, the semiconductor package 100 may be a MCP, such as a UFS including semiconductor chips of different type (hereafter, "different-type semiconductor chips"). The semiconductor package 100 may be a System In Package (SIP) including semiconductor chips stacked or variously arranged in a single package, but being capable of performing a multiplicity of functions associated with an electronic system.

The package substrate 110 may be a substrate having an upper surface 112 and an opposing lower surface 114. The package substrate 110 may include, for example, a printed circuit board (PCB), a flexible substrate, a tape substrate, etc. Here, the PCB may be a multilayer circuit board variously including circuit(s), wiring(s) and through-via(s). The package substrate 110 may include internal wirings that serve as electrical connection path(s) between the first semiconductor chip 200 and one or more of the second semiconductor chips 300.

The package substrate 110 may include a first side portion S1 and an opposing second side portion S2, as well as a third side portion S3 and an opposing fourth side portion S4. Here, the third side portion S3 and the fourth side portion S4 may principally extend in a first (e.g., an X) direction, and the first side portion S1 and the second side portion S2 may principally extend in a second (e.g., a Y) direction. In this regard, the first and second directions define a horizontal plane upon which two or more components (e.g., semiconductor chips) may be vertically "stacked" in a third (or Z) direction substantially perpendicular to the horizontal plane.

The package substrate 110 may include a centrally disposed a chip mounting region MR, wherein the first semiconductor chip 200 (e.g., a controller chip) may be mounted (e.g., mechanically assembled and/or electrically connected).

In some embodiments, the chip mounting region MR may have a substantially rectangular shape. For example, a "width" (measured e.g., in the first direction) of the package substrate 110 may fall within a range of from about 10 mm to about 15 mm, and a "length" (measured e.g., in the second direction) of the package substrate 110 may fall within a range of from about 4 mm to about 7 mm Here, at least one side of the rectangular chip mounting region MR may have a dimension that falls within a range of from about 2 mm to about 4 mm Assuming this geometric nomenclature, respective semiconductor chips, respective chip features, and vertically stacked combinations of semiconductor chips may have a "height" (measured e.g., in the third direction). In this regard, a particular height may be determined (or expressed) in relation to a horizontally disposed surface or feature (e.g., the upper surface 112 of the package substrate 110).

The package substrate 110 may include first substrate pads 120 arranged in the chip mounting region MR and second substrate pads 122 arranged in relation to at least one side portion (e.g., the second side portion S2) of the package substrate 110. The first and second substrate pads 120 and 122 may be respectively connected to various wirings. For example, the wirings may extend from the upper surface 112 of the package substrate 110 and/or from within the package substrate 110. In some embodiments, at least a portion of the wirings may serve as a substrate pad (e.g., a landing pad).

Those skilled in the art will appreciate that various substrate pads and wirings associated with semiconductor packages according to embodiments of the inventive concept may vary in number, shape, type, arrangement and disposition according to design.

A first insulation layer 140 may be formed on the upper surface 112 of the package substrate 110 through which at least portions of the first and second substrate pads 120 and 122 may be exposed. The first insulation layer 140 may completely cover the upper surface 112 of the package substrate 110, excepting portions of the first and second substrate pads 120 and 122. In some embodiments, the first insulation layer may include a solder resist.

The dam structure (e.g., a support frame pattern) 160 may be disposed on the package substrate 110 to substantially surround the chip mounting region MR. For example, the support frame pattern 160 may have an annular shape extending in a closed-loop to define an inwardly-disposed trench 162 encompassing the first semiconductor chip 200. In some embodiments, the support frame pattern 160 may have an annular, rectangle shape and may be formed with a first height H1 measured from the upper surface 112 of the package substrate 110. Here, the first height H1 of the support frame pattern 160 may fall within a range of from about 90 μm to about 120 μm, and include at least one insulating material, such as solder resist.

Accordingly, at least a considerable portion of the chip mounting region MR of the package substrate 110 may be exposed by the trench 162 of the support frame pattern 160.

However, the support frame pattern 160 may be disposed in such a manner between the package substrate 110 and additional components so as to properly support the additional components. In some embodiments, a separating distance 1' between the chip mounting region MR and an inner sidewall of the trench 162 may be at least 350 μm. However, the particular separating distance L between the first semiconductor chip 200 and a sidewall of the trench 162, as well as the width and height of the support frame pattern, the area of the trench 162, etc., may be determined in accordance with the size and shape of the first semiconductor chip 200, as well as an area and a thickness of an adhesive film used to attached the support frame pattern 160, etc.

As noted above, the first semiconductor chip 200 may be mounted on the chip mounting region MR of the package substrate 110, and in some embodiments may be mounted on the package substrate 110 using one or more conductive bumps 230 (e.g., solder bumps). Thus, the first semiconductor chip 200 may be disposed on a front (or active) surface 202 of the first semiconductor chip 200 using first chip pads 210. In some embodiments, the first semiconductor chip 200 may have a quadrangular (or four-sided) shape, and/or the first chip pads 210 may be provided in an two-dimensional array over substantially the entire front surface 202 of the first semiconductor chip 200.

In some embodiments, the first semiconductor chip 200 may be a logic chip including at least one logic circuit, wherein the logic chip may serve as a controller variously controlling the operation of one or more memory chips. Accordingly in various embodiments of the inventive concept, the first semiconductor chip 200 may be a processor chip, such as an Application Specific Integrated Circuit (ASIC), an application processor (AP), a Central Processing Unit (CPU), a Main Processing Unit (MPU), a Graphics Processing Unit (GPU), a System-on-Chip (SoC), etc.

The first semiconductor chip 200 may be mounted on the package substrate 110 by a flip chip bonding method. The first chip pads 210 of the first semiconductor chip 200 may be electrically connected to the first substrate pads 120 of the package substrate 110 by the conductive bumps 230.

In some embodiments, a "thickness" (a dimension measured e.g., in the third direction from a lower surface to an upper surface) of the first semiconductor chip 200 may fall within a range of from about 90 μm to about 110 μm, whereas a height of the underlying conductive bump 230 may fall within a range of from about 35 μm to about 60 μm. Accordingly, an upper surface 204 of the first semiconductor chip 200 may have a second height H2 measured from the upper surface 112 of the package substrate 110 that falls within a range of from about 135 μm to about 160 μm. Here, the second height H2 of the first semiconductor chip 200 may be greater than the first height H1 of the support frame pattern 160. In some embodiments, an outer sidewall of the first semiconductor chip 200 mounted on the package substrate 100 may be separated from an inner sidewall 162a of the support frame pattern 160 by a distance of at least 350 μm.

A thickness of each second semiconductor chip 300 (e.g., 300a, 300b, 300c and 300d) may fall in a range of from 45 μm to 65 μm.

The second semiconductor chips 300 may be attached on the support frame pattern 160 using an adhesive film 320—which may include one or more adhesive film portions. In some embodiments, each of the second semiconductor chips 300 may have a quadrangular shape.

Among the second semiconductor chips, a lowermost second semiconductor chip 300a may be attached on the support frame pattern 160 using a first adhesive film portion 320a. Additional second semiconductor chips (e.g., a first intermediate semiconductor chip 300b, a second intermediate semiconductor chip 300c and an uppermost second semiconductor chip 300d) among the second semiconductor chips 300 may be sequentially stacked on and attached to the lowermost second semiconductor chip 300a respectively using at least one additional adhesive film portion(s) (e.g., second, third and fourth adhesive film portions 320b, 320c and 320d).

In some embodiments, each of the second semiconductor chip may be a memory chip including at least one memory circuit. For example, each of the second semiconductor chips 300 may include a volatile memory device, such as for example, a Dynamic Random Access Memory (RAM) (DRAM), a Synchronous RAM (SRAM), a High Bandwidth Memory (HBM) and/or a nonvolatile memory device, such as for example, a flash memory, a Phase-change RAM (PRAM), a Magnetic RAM (MRAM), and a Resistance RAM (RRAM), etc.

The lowermost second semiconductor chip 300a may be attached on the support frame pattern 160 and the first semiconductor chip 200 using the first adhesive film portion 320a (e.g., a die attach film (DAF)) using, for example, a die attach process. The lowermost second semiconductor chip 300a may include a backside surface exposing a second chip pad 310, wherein the backside surface, when arranged in the stacked second semiconductor chips 300, faces away from the package substrate 110 whereas a frontside (or active) surface of the lowermost second semiconductor chip 300a faces towards the package substrate 110.

In some embodiments, the lowermost second semiconductor chip 300a may be attached to the frame pattern 160 and/or the upper surface 204 of the first semiconductor chip 200 using the first adhesive film portion 320a and a thermal compression process.

The lowermost second semiconductor chip 300a may be pressed onto the support frame pattern 160 using a die attaching tool heated to a high temperature by a heater block in a support system supporting the package substrate 110. In some embodiments, the thickness of the first adhesive film 320a may fall within a range of from about 60 μm to about 120 μm. In this regard, a portion of the DAF having become fluid due to the pressure and temperature may at least partially fill the trench 162 of the support frame pattern 160.

Accordingly, the first adhesive film 320a, once formed, may include a first part P1 covering an upper surface of the support frame pattern 160, a second part P2 at least partially filling a first space (or first gap) between the inner sidewall 162a of the trench 162 and the first semiconductor chip 200, a third part P3 underfilling a second space (or second gap) between a bottom surface 162b of the trench 162 and a lower surface of the first semiconductor chip 200, and a fourth part P4 covering the upper surface 204 of the first semiconductor chip 200. Here, the thickness of the first part P1 may be greater than a thickness of the fourth part P4, wherein the thickness of the first part P1 is about at least 40 μm.

The additional second semiconductor chips 300b, 300c and 300d among the second semiconductor chips 300 may then be sequentially attached on the lowermost second semiconductor chip using the second, third and fourth adhesive film portions 320b, 320c and 320d. For example, the additional second semiconductor chips 300b, 300c and 300d may be sequentially attached to the lowermost second semiconductor chip 300a using the second adhesive film 320b, 320c and 320d, such as a die attach film (DAF), and a die attach process. Respective thicknesses of the second, third and fourth adhesive films 320b, 320c and 320d may fall within a range of from about 10 μm to about 20 μm.

The respective planar area(s) of the second semiconductor chips 300 may be greater than or equal to a planar area of the first semiconductor chip 100 and the support frame pattern 160. Accordingly, the second semiconductor chips 300 may be supported by, and mounted on the package substrate 110 using the support frame pattern 160.

In some embodiments like the one illustrated in FIG. 1, the second semiconductor chips 300 (e.g., second semiconductor chips 300a, 300b, 300c and 300d) may be stacked in a sequentially offset arrangement that forms a cascade-type structure. In this regard, the second semiconductor chips 300 may be sequentially offset in the first (or X) direction on the package substrate 110.

However, those skilled in the art will appreciate that a number, size and/or arrangement of second semiconductor chips 300 may vary by design. Additionally, the number, size, structure, shape and/or arrangement of second chip pads 310 variously associated with the second semiconductor chips 300 may vary by design.

In some embodiments, the second semiconductor chips 300 may be electrically connected to the package substrate 110 by the conductive connection members (e.g., bonding wires) 330. That is, the second chip pads 310 associated with the second semiconductor chips 300 may be variously connected to the second substrate pads 122 disposed on the upper surface 112 of the package substrate 110 by bonding wires 330.

In some embodiments, the sealing member 400 may be formed on the top surface 112 of the package substrate 110 to cover, and thereby protect, a combination of the support frame pattern 160, the second semiconductor chips 300 and the bonding wires 330. The sealing member 400 may include, a thermosetting resin (e.g., EMC).

In some embodiments, external connection pads 130 may be provided on the lower surface 114 of the package substrate 110, and may serve, along with external connection members 500, as respective electrical connections between the semiconductor package 100 and one or more external circuits. The external connection pads 130 may be at least partially exposed through a second insulation layer 150 disposed on the lower surface 114 of the package substrate 110. The second insulation layer 150 may include at least one of silicon oxide, silicon nitride, and/or silicon oxynitride. The external connection members 500 (e.g., solder balls) may be respectively disposed on the external connection pads 130. In some applications, the semiconductor package 100 may be mounted on a module substrate (not illustrated) via the external connection members 500 to form a memory module.

Thus, the semiconductor package 100 of FIG. 1 may include the package substrate 110 having an annular support frame pattern 160 substantially surrounding the first semiconductor chip 200 as it is centrally mounted on the package substrate 110 via an arrangement of conductive bumps 230. The first adhesive film portion 320a is formed on the support frame pattern 160 to cover the first semiconductor chip 200. The second semiconductor chips 300 may be attached to an upper surface of the support frame pattern 160 by the first adhesive film portion 320a, and electrically connected to the package substrate 110 by a plurality of the bonding wires 330. The sealing member 400 may be formed on the package substrate 110 to cover the second semiconductor chips 300 and the bonding wires 330.

Among the second semiconductor chips 300, the lowermost second semiconductor chip 300a may be attached to the support frame 160 and the first semiconductor chip 200 using the first adhesive film (e.g., DAF) portion 320a and a thermal compression process, such that at least part of the first adhesive portion 320a becomes fluid due to pressure and temperature associated with the thermal compression process to at least partially infill the trench 162 disposed on the support frame pattern 160.

In this regard, the support frame pattern 160 may be arranged around the first semiconductor chip 200 and disposed between the package substrate 110 and the stacked arrangement of second semiconductor chips 300 in order to support the second semiconductor chips 300. As a result, the support frame pattern 160 may replace the spacer chip used in conventional semiconductor packages, thereby reducing overall manufacturing costs of semiconductor packages consistent with embodiments of the inventive concept. Further, since the first adhesive film portion 320a at least partially fills the trench 162 between the support frame pattern 160 and the lowermost second semiconductor chip 300a, and also fills a space between the first semiconductor chip 200 and the lowermost second semiconductor chip 300a, the lifting phenomenon conventionally associated with the adhesive film due to height differences between the first semiconductor chip 200 and the support frame pattern 160 may be avoided, thereby improving overall quality of semiconductor packages consistent with embodiments of the inventive concept. Moreover, since the first adhesive film portion 320a infills the space between the package substrate 110 and the first semiconductor chip 200, a conventionally-required capillary underfill process used to fill spaces between the conductive bumps 230 under the first semiconductor chip 200 may be omitted.

Figure 4:
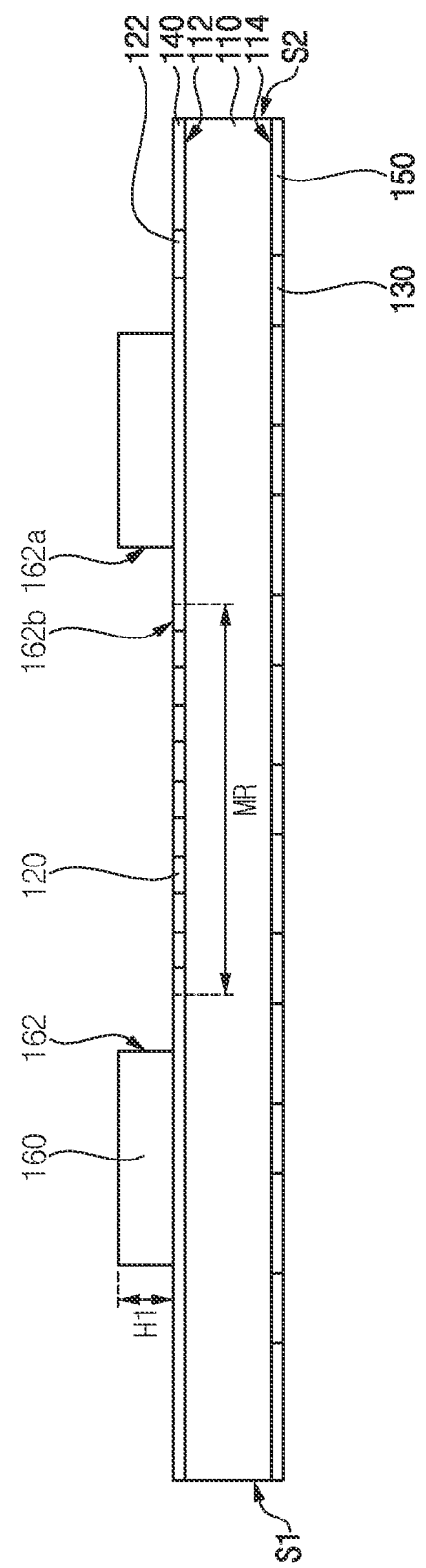
Figure 5:
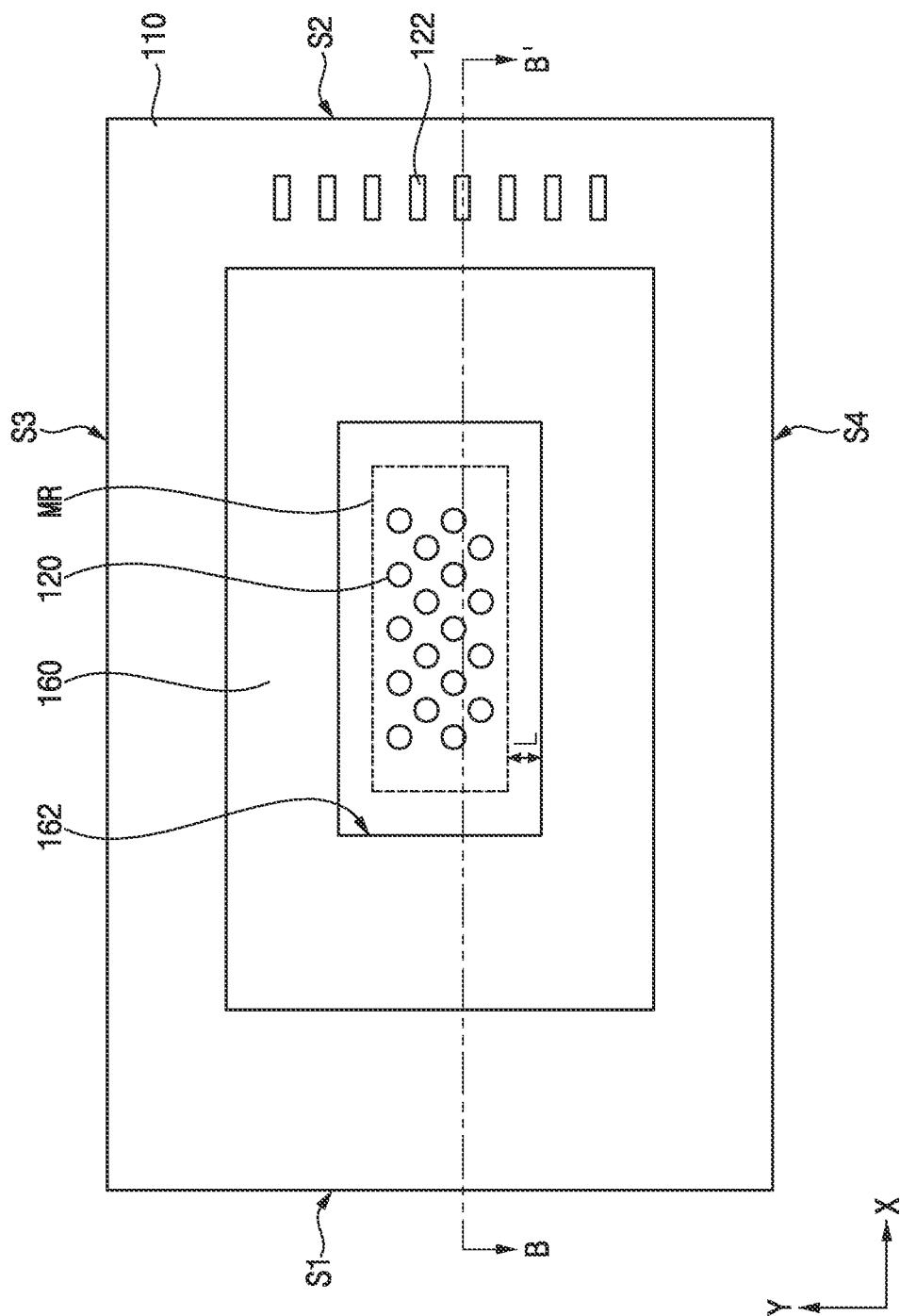

FIGS. 4 to 11 are related plan and cross-sectional views illustrating in one example a method of manufacture for semiconductor packages according to embodiments of the inventive concept. Here, FIG. 5 is a plan view and FIG. 4 is a cross-sectional view taken along line B-B' of FIG. 5.

Referring to FIGS. 4 and 5, the support frame pattern 160 (e.g., an annular-shaped dam structure may be formed on the upper surface 112 of the package substrate 110.

In some embodiments, the package substrate 110 may be a PCB (e.g., a multilayer circuit board including various wiring(s), circuit(s) and/or through vias. The package substrate 110 may also include various internal wirings that serve as electrical connections between components populating the upper and lower surfaces 112, 114 of the package substrate (e.g., the first semiconductor chip 200 and the second semiconductor chips 300).

In this regard, the support frame pattern 160 may be formed in relation to a centrally-disposed chip mounting region MR of the package substrate 110.

As noted above, a width of the package substrate 110 may range from about 10 mm to about 15 mm, and a length of the package substrate 110 may range from about 4 mm to about 7 mm with at least one side of the chip mounting region MR having a dimension ranging between about 2 mm to about 4 mm.

The package substrate 110 may include first substrate pads 120 arranged in the chip mounting region MR and second substrate pads 122 arranged along at least on side (e.g., the second side portion S2) of the package substrate 110. The first and second substrate pads 120 and 122 may be variously and respectively connected by wiring(s) extending on the upper surface 112 of the package substrate 110 and/or extending within the body of the package substrate 110. For example, at least a portion of the wiring(s) may be used as the various substrate pads (e.g., landing pads).

The first insulation layer 140 may be formed on the upper surface 112 of the package substrate 110 through which at least a portion of the first and second substrate pads 120 and 122 may be exposed. That is, the first insulation layer 140 (e.g., a solder resist) may cover the entire upper surface 112 of the package substrate 110, excepting at least upper surfaces of the first and second substrate pads 120 and 122.

In some embodiments, the support frame pattern 160 may be formed with an annular shape on the package substrate 110 to completely surround the chip mounting region MR. That is, the support frame pattern 160 may extend in a closed loop to define the trench 162 and to accommodate the mounting of the first semiconductor chip 200 within the chip mounting region MR. The support frame pattern 160 may have a rectangular shape.

The support frame pattern 160 may be formed with the first height H1 that falls within a range of from about 90 μm to about 120 μm.

The support frame pattern 160 may include at least one insulating material, such as solder resist, wherein the solder resist (e.g., a photosensitive resin) may be coated onto the upper surface 112 of the package substrate 110. Thereafter, an exposure process may be performed on the applied solder resist to cure at least a portion having the rectangular frame shape and leaving an uncured portion may be removed, thereby forming the support frame pattern 160.

In this manner, the chip mounting region MR of the package substrate 110 may be exposed by the trench 162 of the support frame pattern 160, and the support frame pattern 160 may be disposed between the package substrate 110 and other electronic components in order to support the other electronic components.

In some embodiments a distance 'L' between the inner sidewall 162a of the support frame pattern 160 and the chip mounting region MR may be at least about 350 μm. However, the distance between the first semiconductor chip 200 and the inner sidewall 162a of the support frame pattern 160, as well as the width and height of the support frame pattern 160, and the area of the trench, etc. may vary by design in relation to the size and shape of the first semiconductor chip 200, an area and thickness of an adhesive film to be applied on the support frame pattern, etc.

Figure 6:
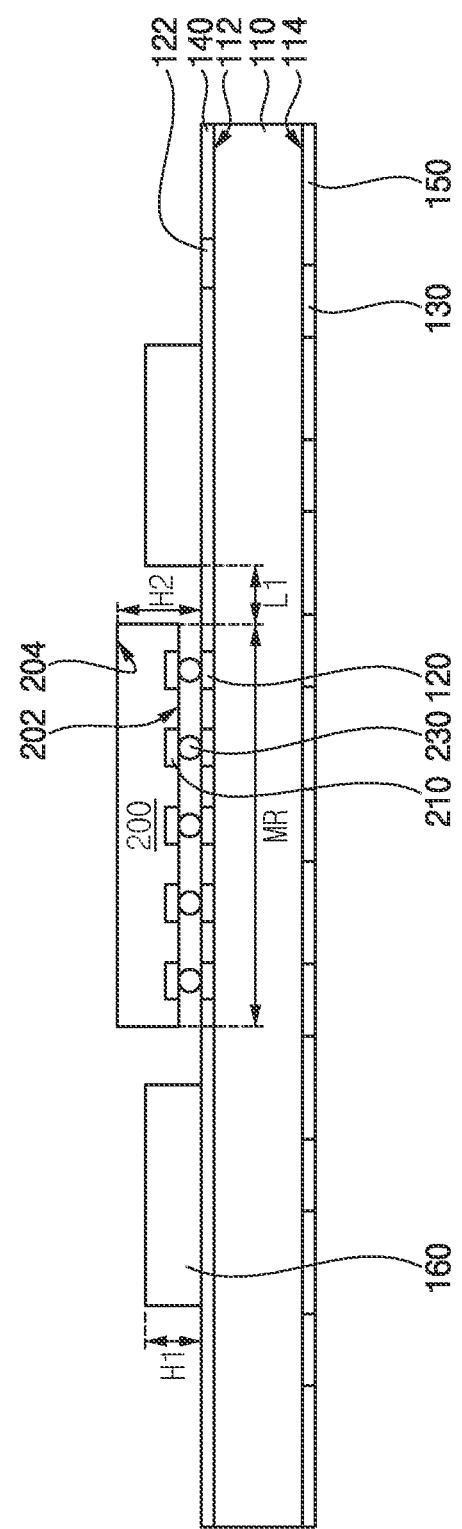

Referring to FIG. 6, the first semiconductor chip 200 may be mounted on the chip mounting region MR of the package substrate 110.

In some embodiments, the first semiconductor chip 200 may be mounted on the package substrate 110 via the conductive bumps 230. The first semiconductor chip 200 may be arranged such that the front (or active) surface 202 on which first chip pads 210 are formed faces towards the package substrate 110. The first semiconductor chip 200 may have a quadrangular shape. The first chip pads 210 may be arranged in an array over substantially the entire front surface 202 of the first semiconductor chip 200.

The first semiconductor chip 200 may be mounted on the package substrate 110 using a flip chip bonding method. Here, the first chip pads 210 of the first semiconductor chip 200 may be electrically connected to the first substrate pads 120 of the package substrate 110 by the conductive bumps 230 (e.g., solder bumps).

As noted above, the thickness T1 of the first semiconductor chip 200 may fall within a range of from about 90 μm to about 110 μm. A height of the conductive bump 230 from the upper surface 112 of the package substrate 110 may fall within a range of from about 35 μm to about 60 μm. The first semiconductor chip 200 may have a second height H2 from the upper surface 112 of the package substrate 110 that falls within a range of from about 135 μm to about 160 μm. Thus, the second height H2 of the first semiconductor chip 200 may be greater than the first height H1 of the support frame pattern 160.

Figure 7:
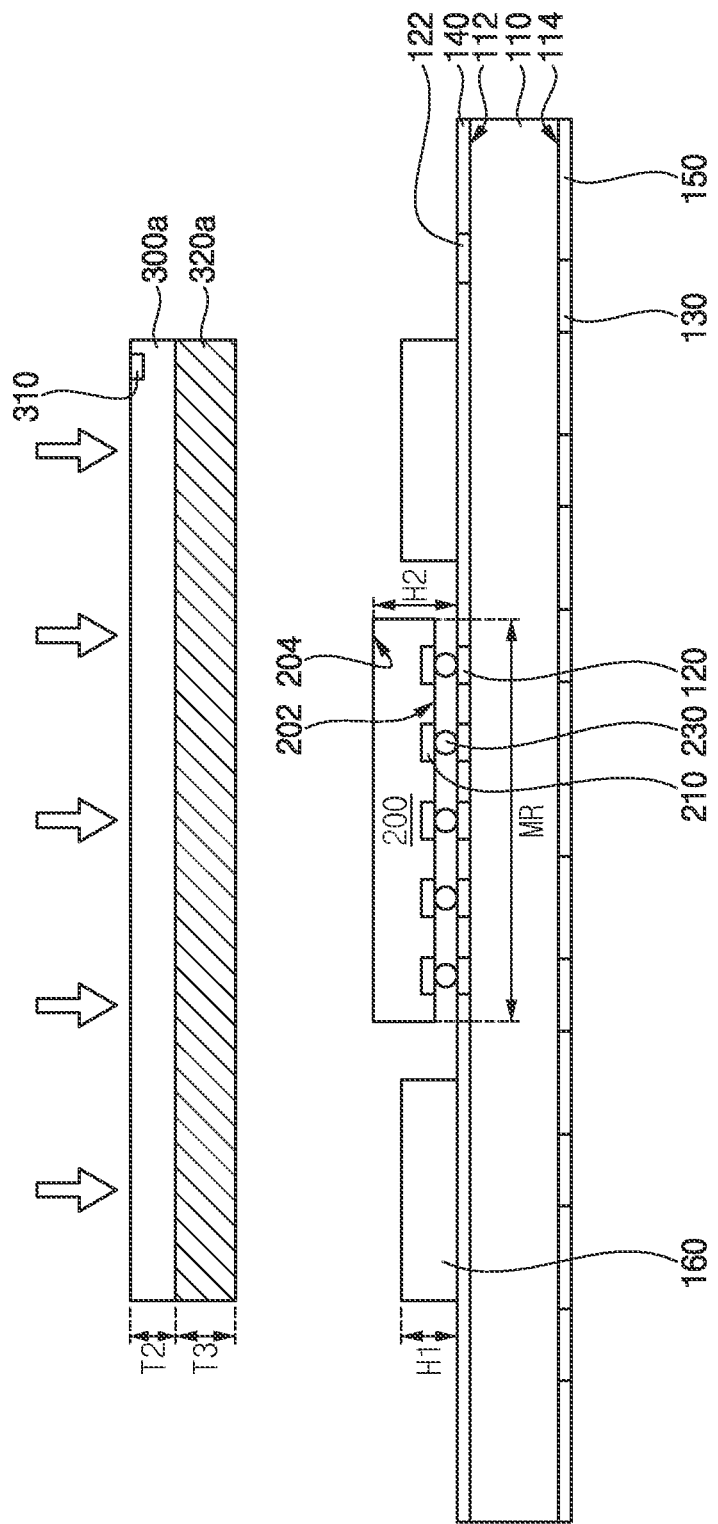
Figure 8:
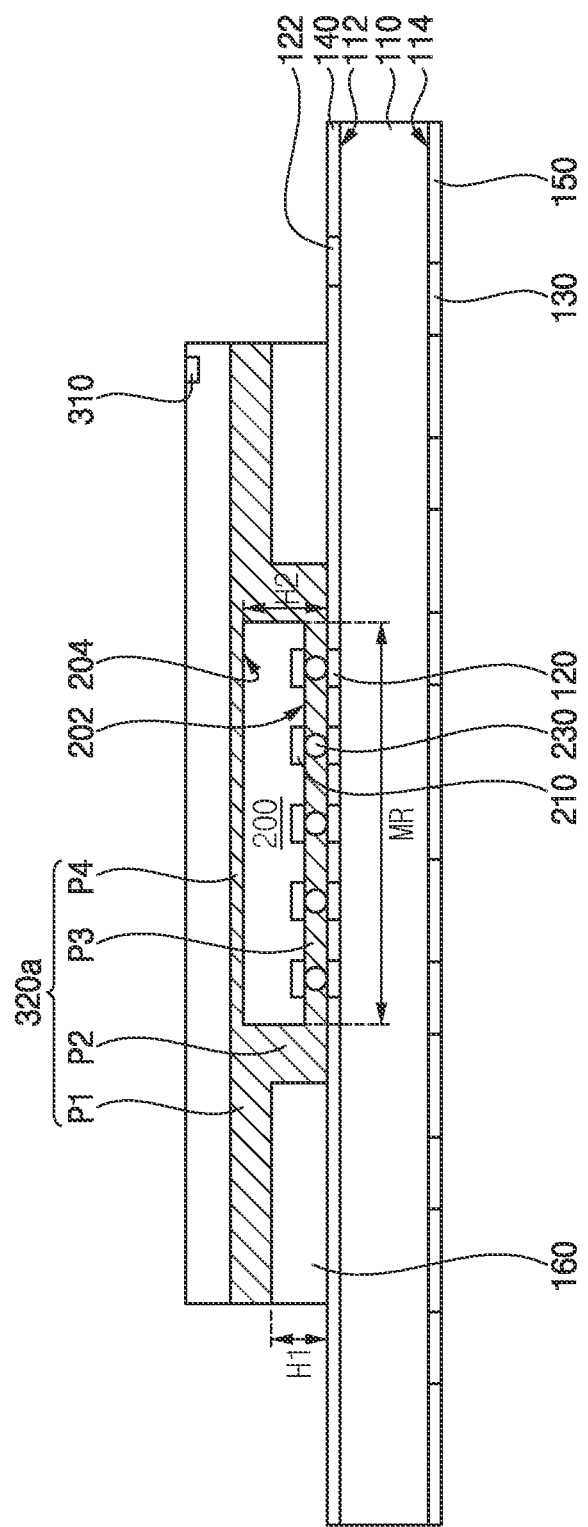
Figure 9:
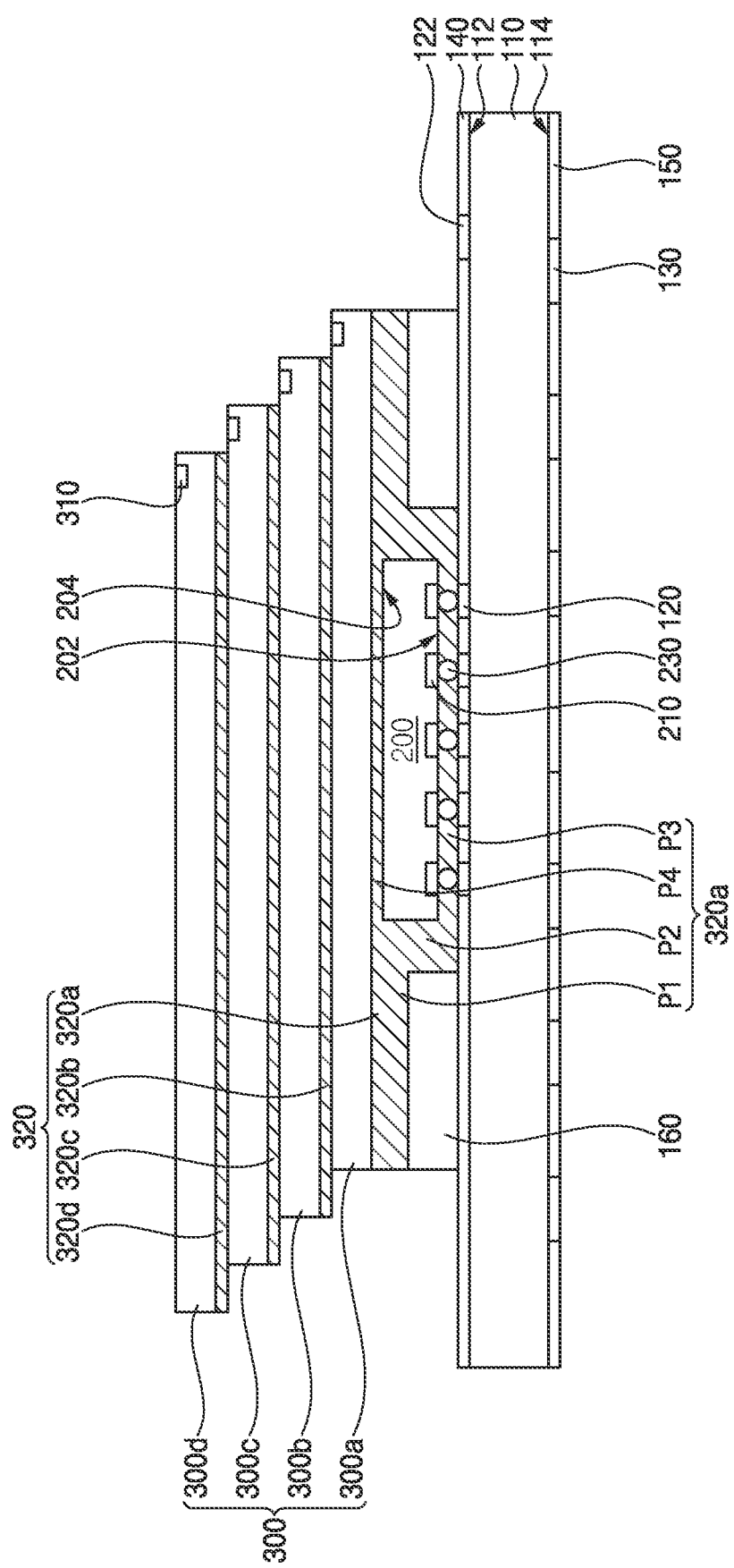

Referring to FIGS. 7, 8 and 9, the second semiconductor chips 300 may be sequentially stack-attached onto an upper surface 204 of the first semiconductor chip 200 and/or an upper surface of the support frame pattern 160 using an adhesive film 320 (e.g., a die attach film (DAF)).

As illustrated in FIGS. 7 and 8, the lowermost second semiconductor chip 300a may be attached on the support frame pattern 160 using the first adhesive film portion 320a. That is, the lowermost second semiconductor chip 300a may be attached to the support frame pattern 160 and/or the first semiconductor chip 200 using the first adhesive film portion 320a by performing a die attach process.

The lowermost second semiconductor chip 300a may be arranged such that the backside surface on which at least one second chip pad 310 is formed faces away from the package substrate 110. Here, each one of the second semiconductor chips 300 may have a quadrangular shape.

Thus, the first adhesive film portion 320a may be attached to a front side surface (opposing the backside surface) of the lowermost second semiconductor chip 300a, and the lowermost second semiconductor chip 300a may be attached to the frame pattern 160 and the first semiconductor chip 200 using, for example, a thermal compression process. Accordingly, the second semiconductor chip 300a may be vertically pressed downward onto the support frame pattern 160 using a die attaching tool while be heated to a high temperature by a heater block in a support system supporting the package substrate 110. Here, the thickness of the first adhesive film 320a may range from about 60 μm to about 120 μm.

During the thermal compression process, at least part of the first adhesive film portion 320a becomes fluid due to the applied pressure and temperature and infills at least a portion of the trench 162. With this resulting structure, the conventionally troublesome lifting phenomenon may be prevented. During the high pressure curing process, the package substrate 110 may be loaded into a pressure chamber and then subjected to high pressure, so that any voids within the part of the first adhesive film portion 320a infilling the trench 162 are removed.

In some embodiments, the first adhesive film portion 320a may include a first part P1 covering an upper surface of the support frame pattern 160, a second part P2 at least partially filling a space between the inner sidewall 162a of the trench 162 and the first semiconductor chip 200, a third part P3 underfilling a space between a bottom surface 162b of the trench 162 and the first semiconductor chip 200, and a fourth part P4 covering the upper (or backside) surface of the chip 200. Here, the thickness of the first part P1 (e.g., at least 40 μm) may be greater than the thickness of the fourth part P4.

As may be understood from FIGS. 7, 8 and 9, the additional second semiconductor chips 300b, 300c and 300d among the second semiconductor chips 300 may be sequentially attached to an upper surface of the lowermost second semiconductor chip 320a using respective second, third and fourth adhesive films portions 320b, 320c and 320d. Here again, the die attach process may be repeatedly used in relation to the additional second semiconductor chips 300b, 300c and 300d. Thicknesses of the second, third and fourth adhesive films portions 320b, 320c and 320d may range from between about 10 μm to about 20 μm.

The second semiconductor chips 300 may be sequentially attached using a lateral offset arrangement forming, for example, stacked stair-stepped or cascade structure. In some embodiments, the second semiconductor chips 300 may be sequentially offset in the first (or X) direction on the package substrate 110.

Figure 10:
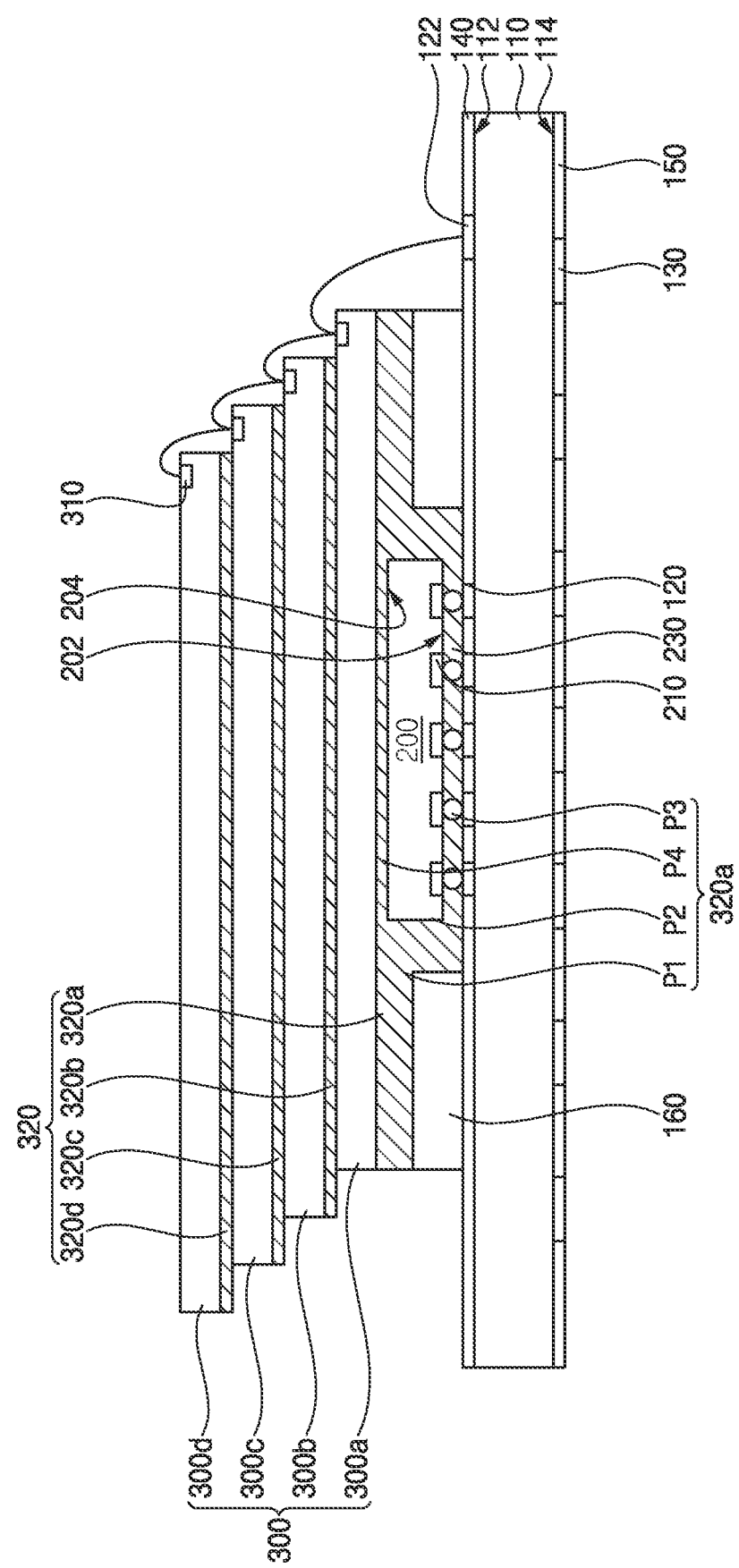

Referring to FIG. 10, each of the second semiconductor chips 300 may be electrically connected to the package substrate 110 using, for example conductive connecting members (e.g., bonding wires) 330. That is, in some embodiments, a wire bonding process may be performed to respectively connect second chip pads 310 associated with the second semiconductor chips 300 to the second substrate pads 122 on the upper surface 112 of the package substrate 110 with various bonding wires 330.

Figure 11:
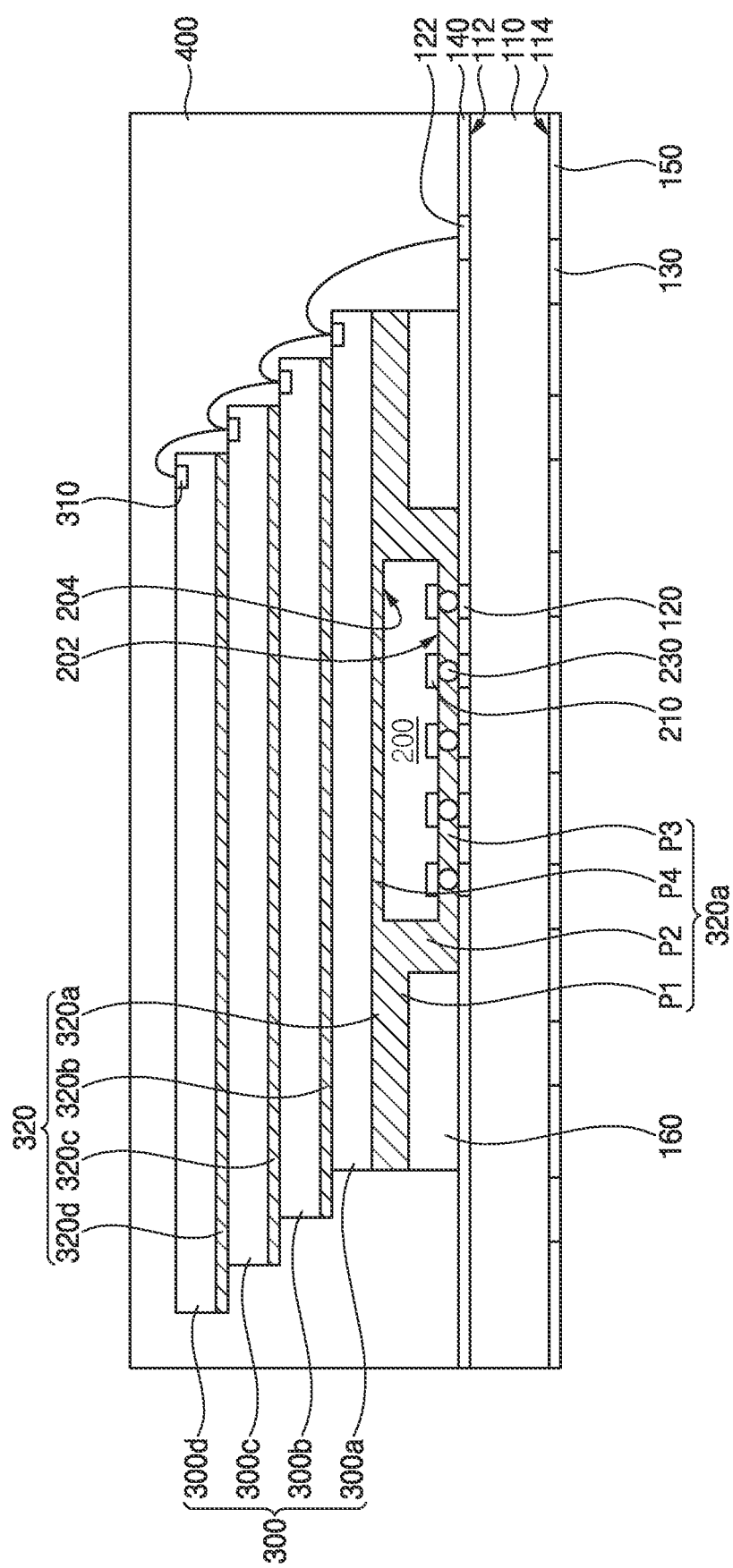

Referring to FIG. 11, the sealing member 400 may be formed on the upper surface 112 of the package substrate 110 to cover a combination of the support frame pattern 160, the second semiconductor chips 300 and the bonding wires 330. Here, the sealing member 400 may include a thermosetting resin (e.g., EMC).

Optionally, external connection members (e.g., solder balls) may be formed on connection pads 130 using (e.g.,) a solder ball formation process to complete the semiconductor package 100 of FIG. 1.

Figure 12:
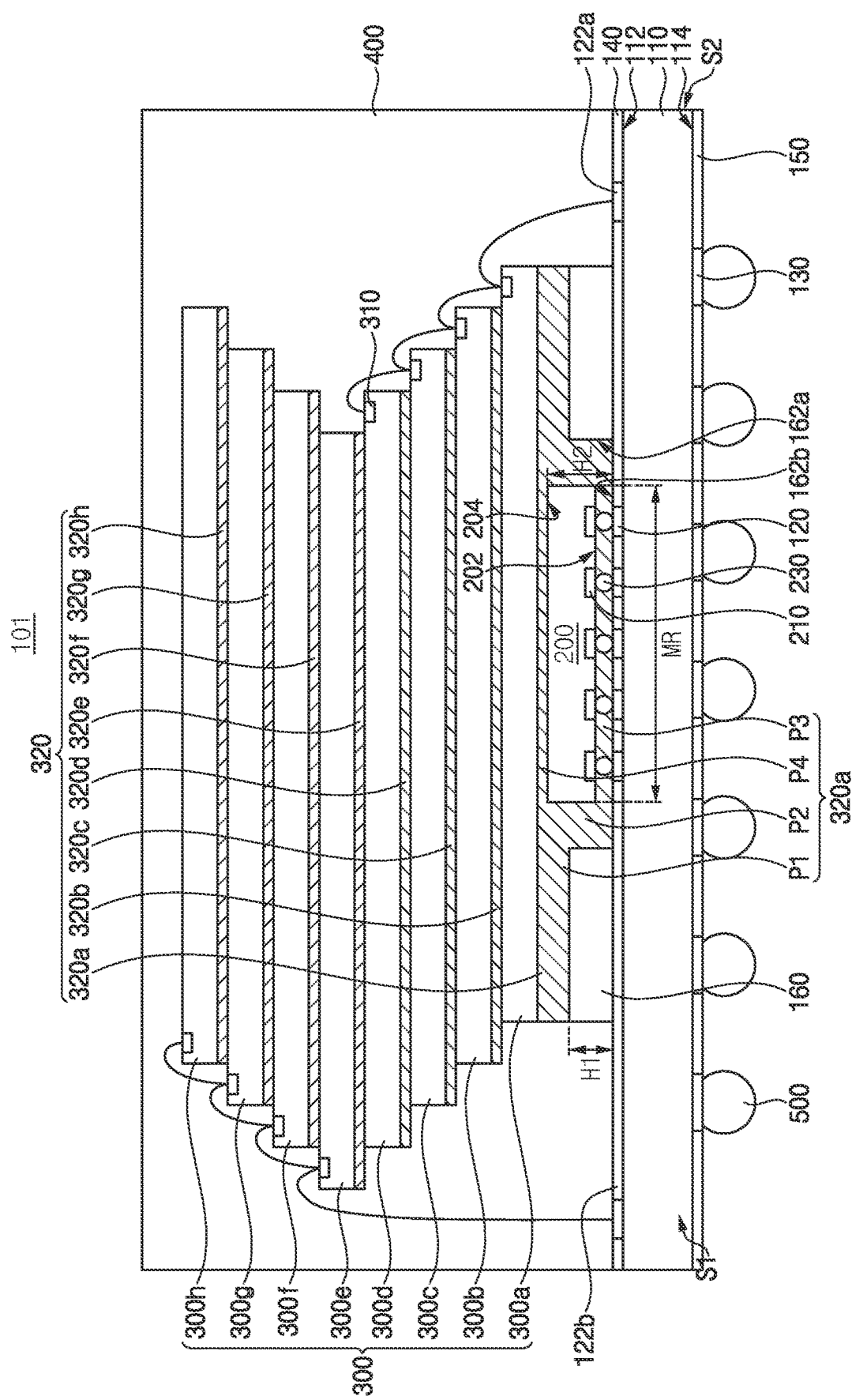
FIGS. 12 and 13 are respective cross-sectional views illustrating various semiconductor packages according to embodiments of the inventive concept.

FIG. 12 is a cross-sectional view illustrating another semiconductor package 101 according to embodiments of the inventive concept. Here, the semiconductor package 101 is substantially similar to the semiconductor package 100 of FIG. 1, except for the further inclusion of still more additional second semiconductor chips.

Referring to FIG. 12, the package substrate 110 of a semiconductor package 101 may include second substrate pads 122a and 122b arranged along the first and second side portions S1 and S2 of the package substrate 110. And as before, the second semiconductor chips 300 may be attached to the support frame pattern 160 using an adhesive film (e.g., a die attach film (DAF)) 320.

However, the second semiconductor chips 300 may be sequentially stacked in an offset zigzag. For example, a first group of the second semiconductor chips (e.g., 300a, 300b, 300c and 300d) may be stacked in a first cascade structure (e.g., offset one way (leftwards) in the first direction), and a second group of the second semiconductor chips (e.g., 300e, 300f, 300g and 300e) may be stacked in a second cascade structure (e.g., offset back in an opposite way (rightward) in the first direction). Collectively, the second semiconductor chips 300 may be attached on the support frame pattern 160 and the first semiconductor chip 200 using the adhesive film 320 (e.g., first, second, third, fourth, fifth, sixth, seventh, and eighth adhesive film portions 320a, 320b, 320c, 320d, 320e, 320f, 320g and 320h). Accordingly, respective second chip pads 310 associated with the first group of second semiconductor chips 300a, 300b, 300c and 300d may be electrically connected to the second substrate pads 122a arranged along the first side portion S1, and respective second chip pads 310 associated with the second group of second semiconductor chips 300e, 300f, 300g and 300e may be electrically connected to the second substrate pads 122b arranged along the second side portion S2.

Figure 13:
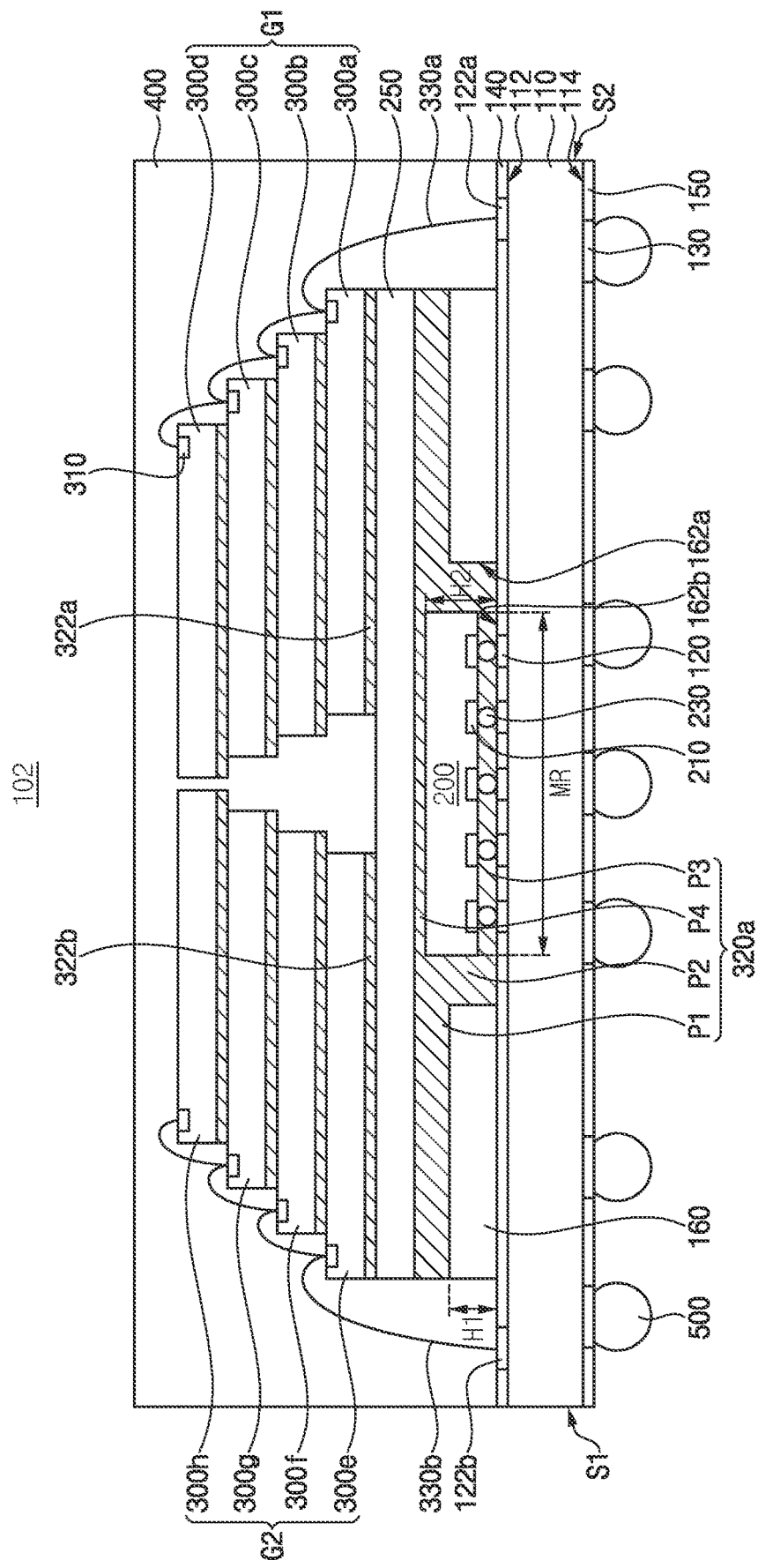

FIG. 13 is a cross-sectional view illustrating yet another semiconductor package 102 according to embodiments of the inventive concept. Here, the semiconductor package 102 may be substantially similar to the semiconductor package 100 of FIG. 1, except for the arrangement of second semiconductor chips 300.

Referring to FIG. 13, the semiconductor package 102 may include a package substrate 110 having the support frame pattern 160 substantially surrounding the first semiconductor chip 200, as well as a spacer chip 250, a first stacked structure G1 of second semiconductor chips 300 and a second stacked structure of second semiconductor chips 300. Here, conductive connection members 330 may be used to variously connect second chips pads 310 associated with the first and second stack structures. As before, the sealing member 400 may be used to cover and protect components and elements arranged on the first surface 112 of the package substrate 110.

In some embodiments, the first adhesive film portion 320a may cover the first semiconductor chip 200 on the support frame pattern 160 and may be attached on the support frame pattern to fill the trench 162 of the support frame pattern 160. The spacer chip 250 may be attached on the support frame pattern 160 and the first semiconductor chip 200 by the first adhesive film portion 320a. The spacer chip 250 may be formed from a cut piece of silicon wafer. The spacer chip 250 may be attached to the support frame pattern 160 and the first semiconductor chip 200 via the first adhesive film portion 320a using a thermal compression process. The spacer chip 250 may be disposed between the package substrate 110 and the first and second stacked structures G1 and G2 and may serve as an additional support structure in relation to the arrangement(s) of second semiconductor chips.

Thus, the first and second stacked structures G1 and G2 may be attached on the spacer chip 250, wherein the first and second stacked structures G1 and G2 may be laterally (e.g., in the first direction) spaced apart on the spacer chip 250. In some embodiments, the first and second stacked structures G1 and G2 may be arranged side by side on the spacer chip 250.

The first stacked structure G1 may include a first group of the second semiconductor chips 300 (e.g., second semiconductor chips 300a, 300b, 300c and 300d). The first group of second semiconductor chips 300a, 300b, 300c and 300d may be sequentially attached on the spacer chip 250 using the third adhesive portions 322a, and may be electrically connected to the package substrate 110 by second conductive connection members 330a (e.g., bonding wires). That is, the second conductive connecting members 330a may respectively connect second chip pads 310 of the first group of second semiconductor chips 300a, 300b, 300c and 300d to second substrate pads 122a of the package substrate 110. Likewise, the second stacked structure G2 may include a second group of the second semiconductor chip 300 (e.g., second semiconductor chips 300e, 300f, 300g and 300h). The second group of second semiconductor chips 300e, 300f, 300g and 300h may be sequentially attached on the spacer chip 250 using third adhesive members 322b, and may be electrically connected to the package substrate 110 by second conductive connection members 330b (e.g., bonding wires). That is, the second conductive connecting members 330b may connect second chip pads 310 of the second group of second semiconductor chips 300e, 300f, 300g and 300h to second substrate pads 122b of the package substrate 110.

Those skilled in the art will appreciate that a number of second semiconductor chips included in the first stack structure G1 and the second stack structure G2 may be the same or different. Further, the number, size, and arrangement of the second semiconductor chips in various stacked structures may vary by design.

From the foregoing, it may be appreciated that semiconductor packages (e.g., MCPs such as UFSs) according to embodiments of the inventive concept may include various semiconductor devices such as logic devices and/or memory devices. For example, semiconductor packages according to embodiments of the inventive concept may include logic devices such as a CPU, a MPU, a GPU and/or AP, as well as volatile memory devices (e.g., DRAM, SRAM, HBM, etc.) and/or non-volatile memory devices (e.g., flash memory, PRAM, MRAM, ReRAM, etc.).

The foregoing embodiments are illustrative in nature and presented as teaching examples. Although only a few embodiments have been described, those skilled in the art will readily appreciate that many modifications are possible materially departing from the scope of the inventive concept as defined by the following claims.

What is claimed is:

1. A semiconductor package, comprising:
    a package substrate including first substrate pads arranged in a chip mounting region and second substrate pads arranged along at least one side portion;
    a first semiconductor chip having a first height, mounted on the chip mounting region and electrically connected to the first substrate pads of the package substrate via conductive bumps;
    a support frame pattern on the package substrate, having a second height less than the first height, surrounding the first semiconductor chip, and defining a trench between the first semiconductor chip and an inner sidewall of the support frame pattern;
    second semiconductor chips stacked on the support frame pattern and the first semiconductor chip;
    an adhesive film attaching the second semiconductor chips to the support frame pattern, wherein at least a portion of the adhesive film at least partially fills the trench;
    conductive connecting members electrically connecting second chip pads respectively associated with the second semiconductor chips with the second substrate pads of the package substrate; and
    a sealing member covering an upper surface of the package substrate, the second semiconductor chips and the conductive connecting members.

2. The semiconductor package of claim 1, wherein the second height falls in a range of from 90 μm to 120 μm, and the first height falls in a range of from 135 μm to 160 μm.

3. The semiconductor package of claim 1, wherein a separating distance between the first semiconductor chip and the inner sidewall of the support frame pattern is at least 350 μm.

4. The semiconductor package of claim 1, wherein the adhesive film includes:
    a first part covering an upper surface of the support frame pattern;
    a second part at least partially filling a first space between the inner sidewall of the support frame pattern and the first semiconductor chip;
    a third part filling a second space between a bottom surface of the trench and a lower surface of the first semiconductor chip; and
    a fourth part covering the upper surface of the first semiconductor chip.

5. The semiconductor package of claim 4, wherein a thickness of the first part of the adhesive film is greater than a thickness of the fourth part of the adhesive film.

6. The semiconductor package of claim 4, wherein the first part of the adhesive film has a thickness of at least 40 μm.

7. The semiconductor package of claim 1, wherein a height of the conductive bumps falls in a range of from 35 μm to 50 μm.

8. The semiconductor package of claim 1, wherein the adhesive film includes a die attach film (DAF).

9. The semiconductor package of claim 1, wherein a thickness of each second semiconductor chip among the second semiconductor chips falls in a range of from 45 μm to 65 μm.

10. The semiconductor package of claim 1, wherein the adhesive film includes a first adhesive film portion and at least one additional adhesive film portion, and
    the second semiconductor chips include:
        a lowermost second semiconductor chip attached to an upper surface of the support frame pattern and an upper surface of the first semiconductor chip using the first adhesive film portion, and
        at least one additional second semiconductor chip attached to the lowermost second semiconductor chip by the at least one additional adhesive film portion.

11. A semiconductor package, comprising:
    a package substrate including first substrate pads arranged in a chip mounting region and second substrate pads arranged along at least one side portion;
    a first semiconductor chip mounted on the chip mounting region and electrically connected to the first substrate pads of the package substrate via conductive bumps;
    a dam structure on the package substrate, surrounding the first semiconductor chip, and defining a trench between the first semiconductor chip and an inner sidewall of the dam structure;
    second semiconductor chips stacked on the support frame pattern and the first semiconductor chip;
    an adhesive film attaching the second semiconductor chips to the support frame pattern, wherein at least a portion of the adhesive film at least partially fills the trench;
    bonding wires electrically connecting second chip pads respectively associated with the second semiconductor chips with the second substrate pads of the package substrate; and
    a sealing member covering the second semiconductor chips.

12. The semiconductor package of claim 11, wherein the dam structure has a first height, and the first semiconductor chip has a second height greater than the first height.

13. The semiconductor package of claim 12, wherein the first height falls in a range of from 90 μm to 120 μm, and the second height falls in range of from 135 μm to 160 μm.

14. The semiconductor package of claim 11, wherein the adhesive film includes:
    a first part covering an upper surface of the dam structure;
    a second part at least partially filling a first space between the inner sidewall of the dam structure and the first semiconductor chip;
    a third part filling a second space between a bottom surface of the trench and a lower surface of the first semiconductor chip; and
    a fourth part covering the upper surface of the first semiconductor chip.

15. The semiconductor package of claim 14, wherein a thickness of the first part is greater than a thickness of the fourth part.

16. The semiconductor package of claim 11, wherein a height of the conductive bumps falls in a range of from 35 μm to 50 μm.

17. The semiconductor package of claim 11, wherein the adhesive film includes a die attach film (DAF).

18. The semiconductor package of claim 11, wherein a thickness of a second semiconductor chip among the second semiconductor chips falls in a range of from 45 μm to 65 μm.

19. The semiconductor package of claim 11, wherein the adhesive film includes a first adhesive film portion and at least one additional adhesive film portion, and
the second semiconductor chips include:
 a lowermost second semiconductor chip attached to an upper surface of the dam structure and an upper surface of the first semiconductor chip using the first adhesive film portion, and
 at least one additional second semiconductor chip attached to an upper surface of the lowermost second semiconductor chip using the at least one additional adhesive film portion.

20. A semiconductor package, comprising:
a package substrate including first substrate pads arranged in a chip mounting region and second substrate pads arranged along at least one side portion;
a first semiconductor chip mounted on the chip mounting region and electrically connected to the first substrate pads of the package substrate via conductive bumps;
a support frame pattern on the package substrate, surrounding the first semiconductor chip, and defining a trench between the first semiconductor chip and an inner sidewall of the support frame pattern;
an adhesive film including a first adhesive film portion and an additional adhesive film portion, wherein the first adhesive film portion at least partially fills the trench;
a group of second semiconductor chips stacked on the support frame pattern, wherein the group of second semiconductor chips includes a lowermost second semiconductor chip attached to an upper surface of the support frame pattern using the first adhesive film portion and an additional second semiconductor chip attached to an upper surface of the lowermost second semiconductor chip using the additional adhesive film portion;
conductive connecting members electrically connecting second chip pads respectively associated with the lowermost second semiconductor chip and the additional second semiconductor chip with the second substrate pads of the package substrate; and
a sealing member formed on an upper surface of the package substrate and covering the second semiconductor chips.

* * * * *